(12) United States Patent
Zhang et al.

(10) Patent No.: US 6,346,851 B1
(45) Date of Patent: Feb. 12, 2002

(54) LOW-PASS FILTER WITH IMPROVED HIGH FREQUENCY ATTENUATION

(75) Inventors: Zhengwei Zhang; James R. Hellums; John M. Muza, all of Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/718,716

(22) Filed: Nov. 22, 2000

Related U.S. Application Data

(60) Provisional application No. 60/170,858, filed on Dec. 14, 1999.

(51) Int. Cl.[7] .................................................. H03K 5/00
(52) U.S. Cl. ........................ 327/558; 327/552; 327/553; 327/336
(58) Field of Search ......................... 327/311, 532–559, 327/336, 345

(56) References Cited

U.S. PATENT DOCUMENTS 5,465,400 A * 11/1995 Norimatsu .................... 455/76
5,764,095 A * 6/1998 Carobolante ................. 327/345
5,999,043 A * 12/1999 Zhang et al. ................. 327/558

* cited by examiner

*Primary Examiner*—Dinh T. Le
(74) *Attorney, Agent, or Firm*—Alan K. Stewart; Wade James Brady, III; Frederick J. Telecky, Jr.

(57) ABSTRACT

A low-pass filter circuit includes: a first compound transistor device (22) and (24) coupled between an input node (30) and an output node (32); a first transistor (20) coupled to the input node (30), a gate of the first transistor (20) is coupled to a drain of the first transistor (20); a second compound transistor device (36) and (38) coupled between a gate of the first compound transistor device (22) and (24) and the gate of the first transistor (20); a second transistor (34) coupled to the first transistor (20) and having a gate coupled to a gate of the second compound transistor device (36) and (38), the gate of the second transistor (34) is coupled to a drain of the second transistor (34); a current source (26) coupled to the drain of the second transistor (34); a first capacitor (C1) coupled to the output node (32); and a second capacitor (C2) coupled to the gate of the first compound transistor device (22) and (24).

18 Claims, 4 Drawing Sheets

US 6,346,851 B1

LOW-PASS FILTER WITH IMPROVED HIGH FREQUENCY ATTENUATION

This application claims priority under 35 USC §119 (e)(1) of provisional application Ser. No. 60/170,858 filed Dec. 14, 1999.

FIELD OF THE INVENTION

This invention generally relates to electronic systems and in particular it relates to low-pass filters.

BACKGROUND OF THE INVENTION

The prior art simple low-pass filter shown in FIG. 1 includes transistors 20, 22, and 24; current source 26; capacitor C1; input node 30; and output node 32. The limited high frequency attenuation of the prior art low-pass filter shown in FIG. 1 is due to signal feed forward through the gate-to-drain capacitance (C3) of transistor 24. The maximum attenuation is C3/C1. Since transistors 22 and 24 are not totally off, the feed forward capacitance is usually much higher than C3. Unlike a true R-C filter, which has no zero, the simple configuration shown in FIG. 1 has a zero at a certain frequency.

SUMMARY OF THE INVENTION

Generally, and in one form of the invention, the low-pass filter circuit includes: a first compound transistor device coupled between an input node and an output node; a first transistor coupled to the input node, a gate of the first transistor is coupled to a drain of the first transistor; a second compound transistor device coupled between a gate of the first compound transistor device and the gate of the first transistor; a second transistor coupled to the first transistor and having a gate coupled to a gate of the second compound transistor device, the gate of the second transistor is coupled to a drain of the second transistor; a current source coupled to the drain of the second transistor; a first capacitor coupled to the output node; and a second capacitor coupled to the gate of the first compound transistor device.

DETAILED DESCRIPTION OF PREFERRED EMBODIMENTS

Figure 2:
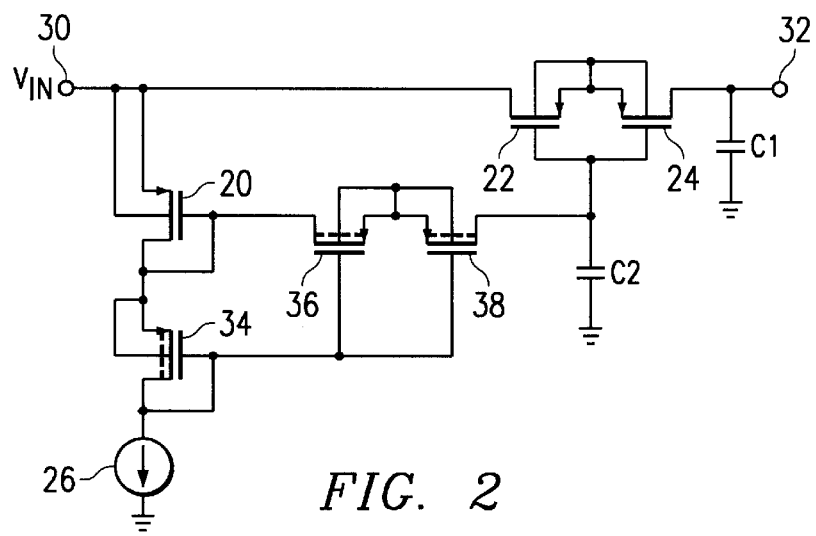
FIG. 2 is a schematic circuit diagram of a preferred embodiment coupled pair low-pass filter.

A preferred embodiment coupled pair low-pass filter is shown in FIG. 2. The circuit of FIG. 2 includes transistors 20, 22, and 24; current source 26; capacitor C1; input node 30; output node 32; transistors 34, 36, and 38; and capacitor C2. In the circuit of FIG. 2, transistors 36 and 38 form a compound transistor device biased through transistor 34. Transistors 36 and 38 serve as a low pass filter for the input signal Vin at node 30 to the gate of the compound transistor device formed by transistors 22 and 24.

Figure 1:
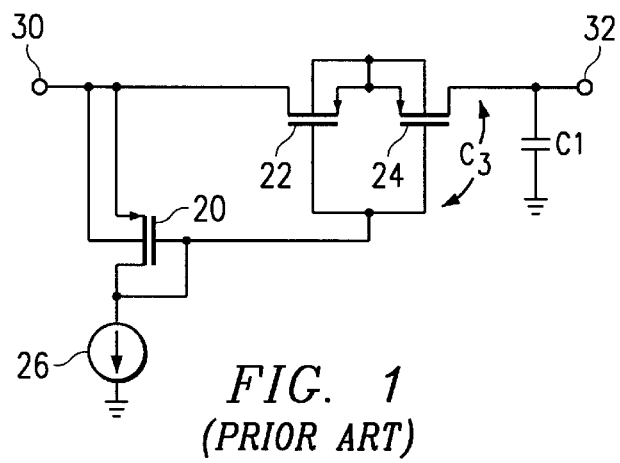
FIG. 1 is a schematic circuit diagram of a prior art low-pass filter.
Figure 3:
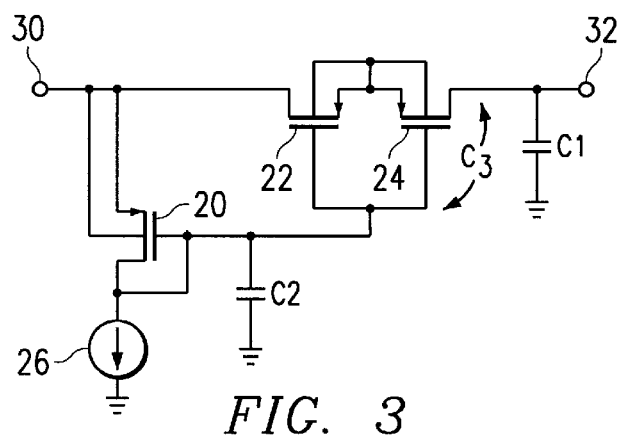
FIG. 3 is a schematic circuit diagram of a second preferred embodiment low-pass filter.

The coupled configuration of FIG. 2 is excellent for noise filtering for a DC voltage reference such as bandgap voltage and transistor backgate connecting voltage. But the input voltage swing range is lowered due to two transistor threshold voltage ($V_T$) drops. For some applications such as anti-alias filter, the input swing range is important. A second preferred embodiment low-pass filter, shown in FIG. 3, has a higher stop band attenuation than the simple prior art configuration of FIG. 1. The circuit of FIG. 3 includes transistors 20, 22, and 24; current source 26; capacitors C1 and C2; input node 30; and output node 32. In the circuit of FIG. 3, transistor 20 and capacitor C2 form a low pass filter which prevents high frequency input signal feed forward through gate-to-drain capacitance (C3) of transistor 24.

Due to temperature and process variation, the pole location of these low pass filters will change. A higher order cascaded low-pass filter is used to make such pole variation tolerable. The circuits of FIGS. 4 and 5 are examples of fifth order low-pass filters.

Figure 4:
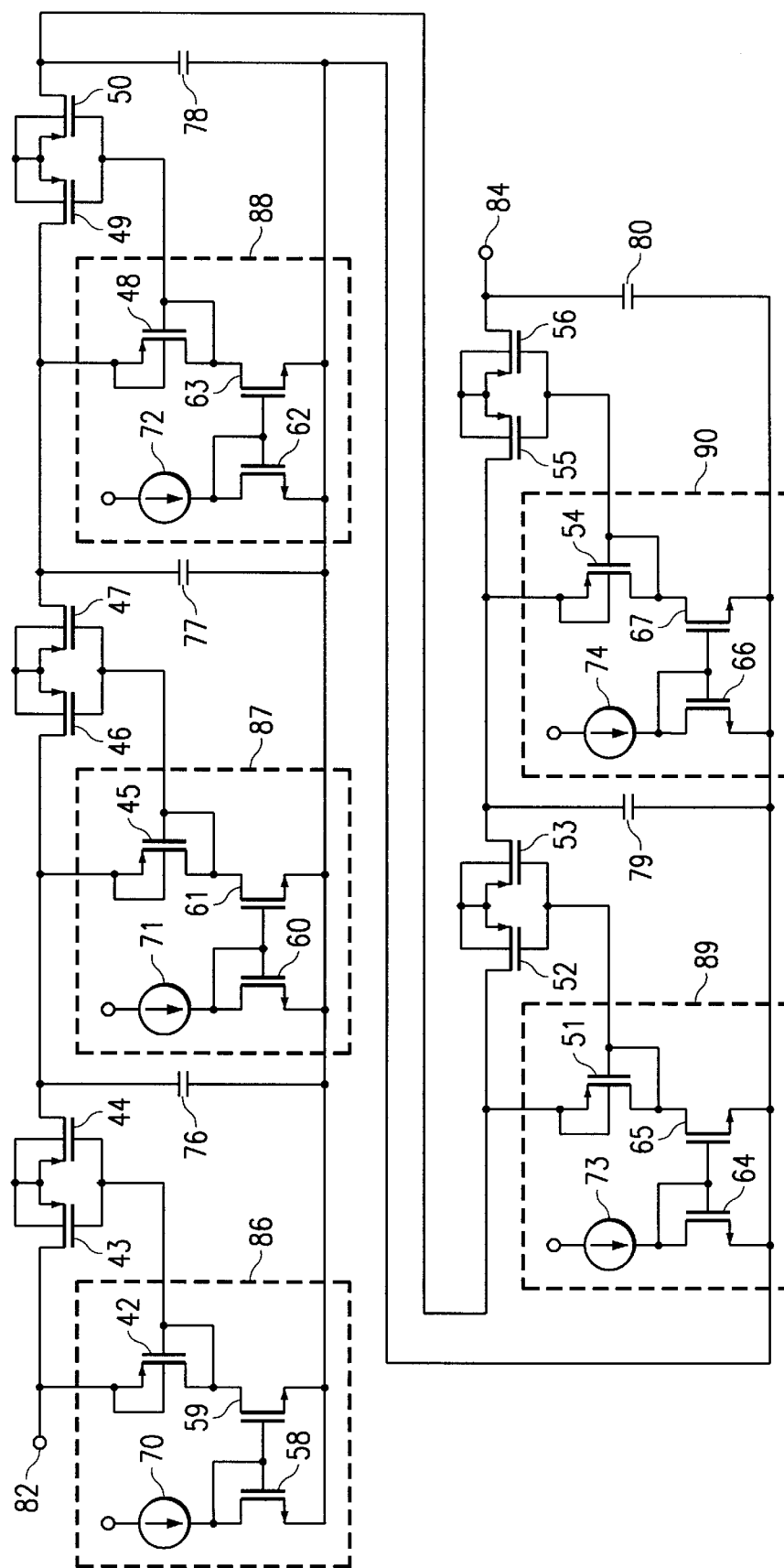
FIG. 4 is a schematic circuit diagram of a fifth order low-pass filter with independent bias circuits for each stage.

The circuit of FIG. 4 includes PMOS transistors 42–56; NMOS transitors 58–67; current sources 70–74; capacitors 76–80; input node 82; and output node 84. The circuit of FIG. 4 uses independent bias circuits 86–90 for each stage.

Figure 5:
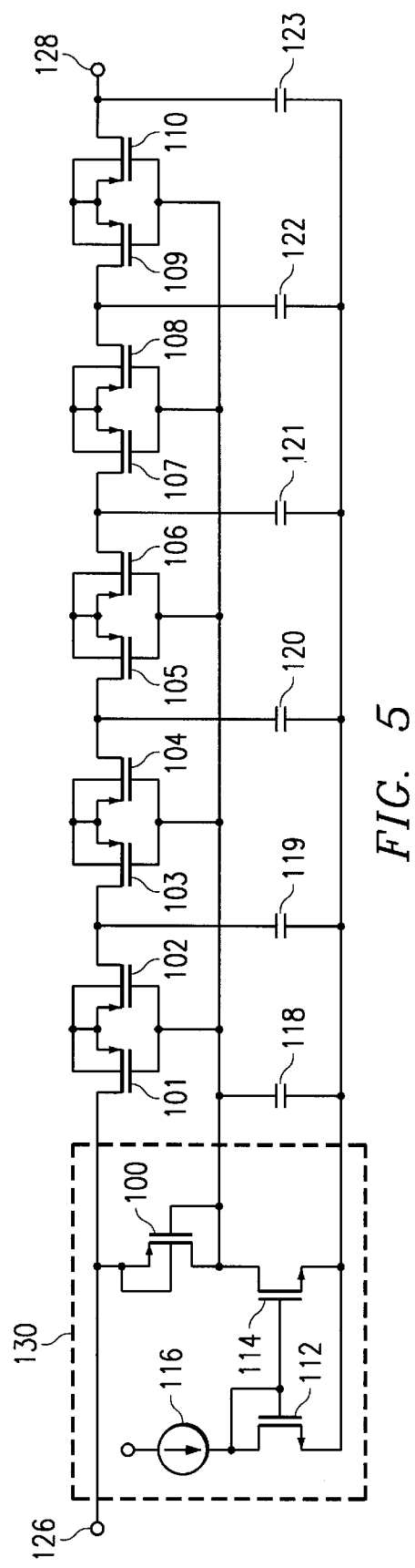
FIG. 5 is a schematic circuit diagram of a fifth order low-pass filter with one common bias circuit.

The circuit of FIG. 5 includes PMOS transistors 100–110; NMOS transistors 112 and 114; current source 116; capacitors 118–123; input node 126; and output node 128. The circuit of FIG. 5 uses one common bias circuit 130.

For all the circuits in FIGS. 2, 3, 4, and 5, the pole location can be adjusted by programming the value of the current sources.

Figure 6:
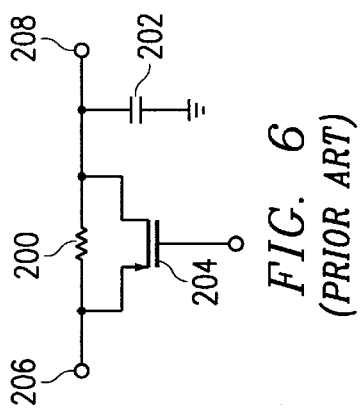
FIG. 6 is a schematic circuit diagram of a traditional prior art low-pass filter with a by-pass transistor.

One advantage of the above circuits is the inherent fast power-up feature when compared with traditional prior art low-pass filters which commonly have a large on-chip resistor and an off-chip capacitor. For fast start-up, the traditional prior art low-pass filter needs a by-pass signal to temporarily short the resistor to quickly charge up the external capacitor to the reference voltage, as shown in FIG. 6. The prior art circuit of FIG. 6 includes internal resistor 200, external capacitor 202, bypass transistor 204, input node 206, and output node 208. Internal resistor 200 is on the order of 200 K ohms.

Figure 7:
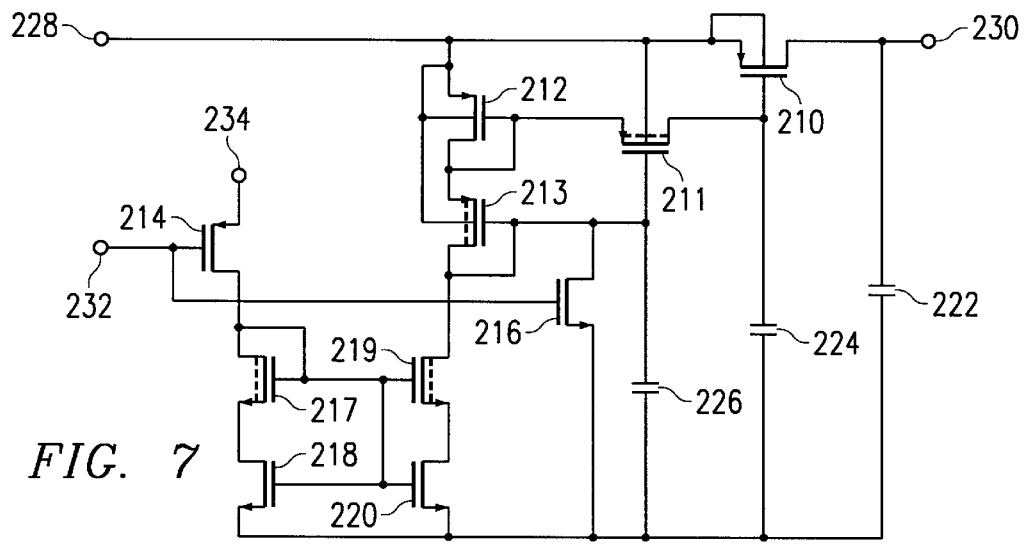
FIG. 7 is a schematic circuit diagram of a first preferred embodiment low-pass filter.

In the embodiment shown in FIG. 7, the low-pass filter uses transistor 210 as a resistor. The circuit of FIG. 7 includes PMOS transistors 210–214; NMOS transistors 216–220; capacitors 222, 224, and 226; input node 228; output node 230; power down node 232; and bias current node 234. Transistors 217–220 form a current mirror. Transistors 214 and 216 serve as switches controlled by the power down node 232. When in power down mode (when power down node 232 is high), all node voltages are set to ground. When in start-up mode, all transistors are in low impedance state and output node 230 is quickly brought up to the voltage on input node 228. For the circuit of FIG. 7, the start-up time is less than ten micro-seconds.

Figure 8:
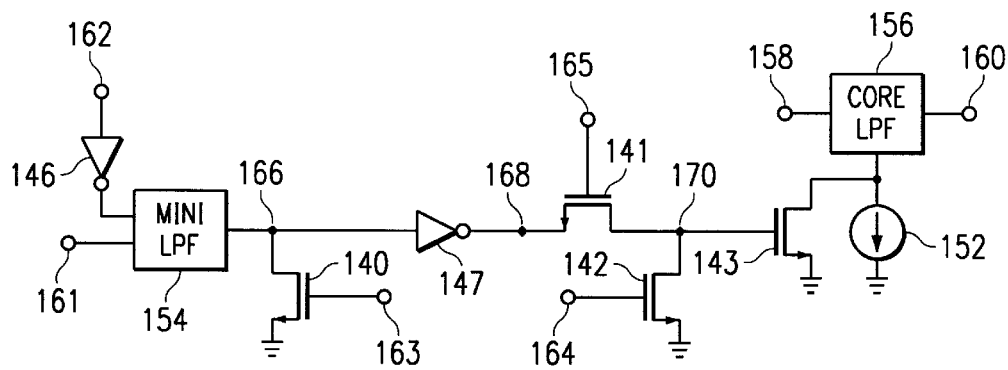
FIG. 8 is a schematic circuit diagram of a first alternative embodiment low-pass filter start-up circuit.

A first alternative embodiment start-up circuit shown in FIG. 8 includes NMOS transistors 140–143; inverters 146 and 147; current source 152; mini low-pass filter 154; core low-pass filter 156; input node 158; output node 160; and bias current node 161. Transistors 141 and 142 are small size switches, while transistor 143 has a long channel length to ensure its leakage is small compared to normal current bias levels of current source 152 of, for example, 40 nA. Low-pass filters 154 and 156 are low-pass. filters such as the ones shown in FIGS. 1 and 2. Mini low-pass filter 154 has a much smaller capacitor C1 than core low-pass filter 156. As an example, for mini low-pass filter 154, capacitor C1 is on the order of 50 fF to 200 fF, whereas, for core low-pass filter 156, capacitor C1 is on the order of 80 pF. Nodes 162, 163, and 164 are coupled to the power down signal of the system. Node 165 is coupled to the inverted power down signal. Current source 152 represents bias current source 26 in FIGS. 1 and 2. Node 161 provides bias current to mini low-pass filter 154.

In the start-up circuit of FIG. 8, transistor 143 is used to provide a much larger current to the core low-pass filter 156 than is provided by current source 152. This effectively lowers the impedance of low-pass filter 156 and charges capacitor C1 much faster. Initially in complete power down, the power down signal is high, node 166 is low, node 168 is high, node 170 is low, and transistor 143 is off. When the power down signal goes low signaling the turn on of the circuit, node 170 goes high because switch (transistor) 141 closes while switch (transistor) 142 opens, and node 168 remains high. Node 168 remains high until node 166 slowly charges to a logic high. Mini low-pass filter 154 ensures that node 166 will take very long to rise which keeps a high gate-to-source voltage on transistor 143 in order to provide a high current to low-pass filter 156 to charge capacitor C1. Once node 166 reaches the trip point of inverter 147, node 168 will go low and shut off transistor 143. This puts low-pass filter 156 back into normal operating mode. This circuit costs very little silicon area and allows control of the start-up time.

The time it takes for node 166 to charge to the trip point of inverter 147 is given by the following equation:

$$dVA/dt = Imini/Cmini$$

$$\Delta t = Vtrip * Cmini/Imini$$

Figure 9:
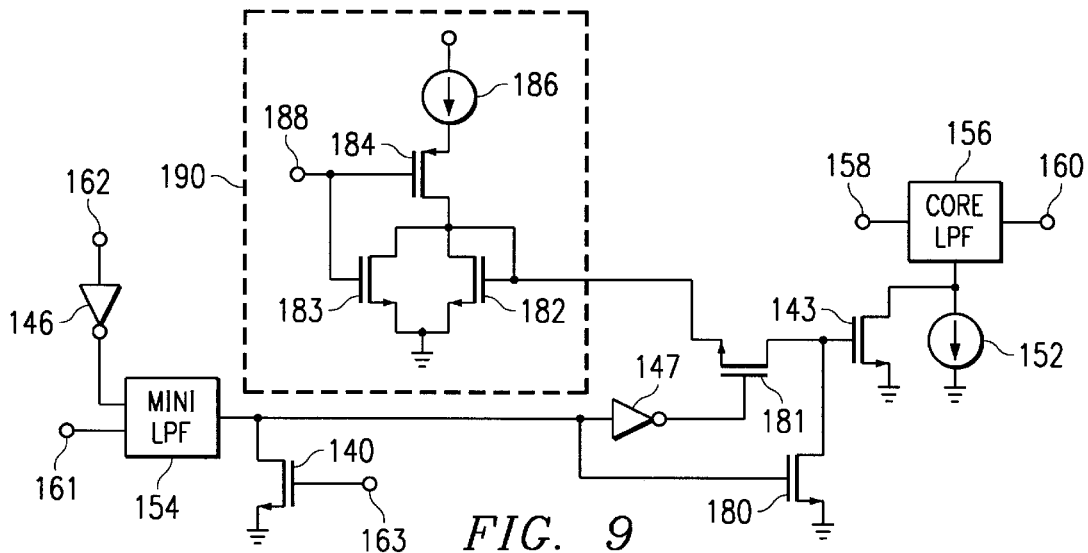
FIG. 9 is a schematic circuit diagram of a second alternative embodiment low-pass filter start-up circuit.

VA is the voltage at node 166, Imini is the bias current of mini low-pass filter 154, Cmini is capacitor C1 of mini low-pass filter 154, and Vtrip is the trip voltage of inverter 147. Δt is approximately the time transistor 143 is flowing maximum current. The main design parameter is then making sure Δt is long enough for transistor 143 to fully charge the big capacitor C1 of low-pass filter 156. If transistor 143 shuts off prematurely, then whatever delta error voltage the main low-pass filter 156 output has left will take multiple seconds to settle out. Because the current through transistor 143 is only a one time burst of current, it is not a problem to design enough margin into Δt to ensure that capacitor C1 is charged before transistors 143 shuts A more controlled current through transistor 143 is obtained with a slightly different scheme, as shown in FIG. 9. The second alternative embodiment start-up circuit of FIG. 9 includes NMOS transistors 140, 143, and 180–183; PMOS transistor 184; inverters 140 and 147; current sources 152 and 186; mini low-pass filter 154; core low-pass filter 156; input node 158; output node 160; and bias current node 161. Nodes 162 and 188 are coupled to the power down signal. The primary difference between the circuit of FIG. 9 and the circuit of FIG. 8 is that, in the circuit of FIG. 9, the gate of transistor 143 has a set bias voltage from bias circuit 190 so that transistor 143 will have a fixed current in start-up mode. Transistor 20 in the core low-pass filter 156 in both FIGS. 8 and 9 must be sized to handle the larger start-up current so that the gate-to-source voltage does not become too large.

While this invention has been described with reference to an illustrative embodiment, this description is not intended to be construed in a limiting sense. Various modifications and combinations of the illustrative embodiment, as well as other embodiments of the invention, will be apparent to persons skilled in the art upon reference to the description. It is therefore intended that the appended claims encompass any such modifications or embodiments.

What is claimed is:

1. A low-pass filter circuit comprising:
   a first compound transistor device coupled between an input node and an output node;
   a first transistor coupled to the input node, a gate of the first transistor is coupled to a drain of the first transistor;
   a second compound transistor device coupled between a gate of the first compound transistor device and the gate of the first transistor;
   a second transistor coupled to the first transistor and having a gate coupled to a gate of the second compound transistor device, the gate of the second transistor is coupled to a drain of the second transistor;
   a current source coupled to the drain of the second transistor;
   a first capacitor coupled to the output node; and
   a second capacitor coupled to the gate of the first compound transistor device.

2. The circuit of claim 1 wherein the first compound transistor device comprises:
   a third transistor; and
   a fourth transistor coupled in series with the third transistor, a gate of the fourth transistor is coupled to a gate of the third transistor.

3. The circuit of claim 2 wherein the third and fourth transistors are PMOS transistors.

4. The circuit of claim 1 wherein the second compound transistor device comprises:
   a third transistor; and
   a fourth transistor coupled in series with the third transistor, a gate of the fourth transistor is coupled to a gate of the third transistor.

5. The circuit of claim 4 wherein the third and fourth transistors are PMOS transistors.

6. The circuit of claim 1 wherein the first and second transistors are PMOS transistors.

7. A start-up circuit for a low-pass filter comprising:
   a core low-pass filter circuit having an input node and an output node;
   a bias current source coupled to the core low-pass filter circuit;
   a start-up transistor coupled in parallel with the bias current source;
   a first switch coupled to a control node of the start-up transistor for turning on the start-up transistor during a start-up time.

8. The circuit of claim 7 further comprising:
   a mini-low pass filter; and
   an inverter coupled between an output of the mini low-pass filter and the first switch.

9. The circuit of claim 8 further comprising a second switch coupled between the control node of the start-up transistor and a ground node.

10. The circuit of claim 7 wherein the start-up transistor is an NMOS transistor.

11. The circuit of claim 9 further comprising a third switch coupled between the putput of the mini low-pass filter and the ground node.

12. The circuit of claim 7 further comprising:
   a bias circuit coupled to the first switch; and
   a mini low-pass filter having an output coupled to a control node of the first switch through an inverter.

13. The circuit of claim 12 further comprising a second switch coupled between the control node of the start-up transistor and a ground node.

14. The circuit of claim 13 wherein a control node of the second switch is coupled to the output of the mini low-pass filter.

15. A low-pass filter circuit comprising:
   a first transistor coupled between an input node and an output node;
   a second transistor coupled to the input node, a gate of the second transistor is coupled to a drain of the second transistor;
   a third transistor coupled between a gate of the first transistor and the gate of the second transistor;
   a fourth transistor coupled to the second transistor and having a gate coupled to a gate of the third transistor, the gate of the fourth transistor is coupled to a drain of the fourth transistor;
   a current mirror coupled to the drain of the fourth transistor;
   a first capacitor coupled to the output node;
   a second capacitor coupled to the gate of the first transistor; and
   a third capacitor coupled to the gate of the third transistor.

16. The circuit of claim 15 wherein the current mirror comprises:
   a first branch coupled to the drain of the fourth transistor; and
   second branch coupled to a bias current node.

17. The circuit of claim 16 further comprising a switch coupled between the second branch and the bias current node, a control node of the switch is coupled to a power down node.

18. The circuit of claim 15 further comprising a switch coupled between the gate of the third transistor and a ground node, a control node of the switch is coupled to a power down node.

* * * * *